United States Patent
Kajiyama

(10) Patent No.: US 8,492,830 B2
(45) Date of Patent: Jul. 23, 2013

(54) MULTIPLE CHANNEL FIN-FET AND ITS MANUFACTURING METHOD

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,534

(22) Filed: Sep. 19, 2011

(65) Prior Publication Data

US 2012/0248527 A1 Oct. 4, 2012

(30) Foreign Application Priority Data

Mar. 28, 2011 (JP) ................... 2011-070794

(51) Int. Cl.
*H01L 29/66* (2006.01)
*H01L 21/336* (2006.01)

(52) U.S. Cl.
USPC ........... 257/330; 257/288; 257/327; 257/332; 438/230; 438/270

(58) Field of Classification Search
USPC .............. 257/302, 330–335, E29.2, E29.201, 257/E29.256, E29.257, E29.26, E29.262, 257/E27.091, E27.095, E21.54; 438/242, 438/259, 270, 400, 700
See application file for complete search history.

(56) References Cited

U.S. PATENT DOCUMENTS

| | | | | |
|---|---|---|---|---|
| 7,394,116 B2 * | 7/2008 | Kim et al. | ...................... | 257/213 |
| 7,952,140 B2 * | 5/2011 | Jang et al. | ...................... | 257/331 |
| 7,972,914 B2 * | 7/2011 | Kim et al. | ...................... | 438/173 |
| 2005/0285204 A1 | 12/2005 | Kim et al. | | |
| 2010/0006930 A1 * | 1/2010 | Mikasa | .......................... | 257/332 |
| 2010/0264494 A1 * | 10/2010 | Doyle et al. | .................. | 257/365 |

FOREIGN PATENT DOCUMENTS

JP 2006-013521 1/2006

OTHER PUBLICATIONS

Chung, et al. 2006. Highly Scalable Saddle-Fin (S-Fin) Transistor for Sub-50nm DRAM Technology. *Symposium on VSLI Technology Digest of Technical Papers*, pp. 32-33.

* cited by examiner

*Primary Examiner* — Julio J Maldonado
*Assistant Examiner* — Cory Eskridge
(74) *Attorney, Agent, or Firm* — Knobbe, Martens, Olson & Bear, LLP

(57) ABSTRACT

According to one embodiment, a semiconductor memory device includes a semiconductor substrate having a gate groove and first to third grooves, the first to third grooves being formed on a bottom surface of the gate groove and the third groove being formed between the first and second grooves, and a gate electrode having a first gate portion formed in the first groove, a second gate portion formed in the second groove, a third gate portion formed in the third groove, and a fourth gate portion formed in the gate groove. A cell transistor having the gate electrode has a first channel region formed in the semiconductor substrate between the first and third gate portions and a second channel region formed in the semiconductor substrate between the second and third gate portions.

7 Claims, 18 Drawing Sheets

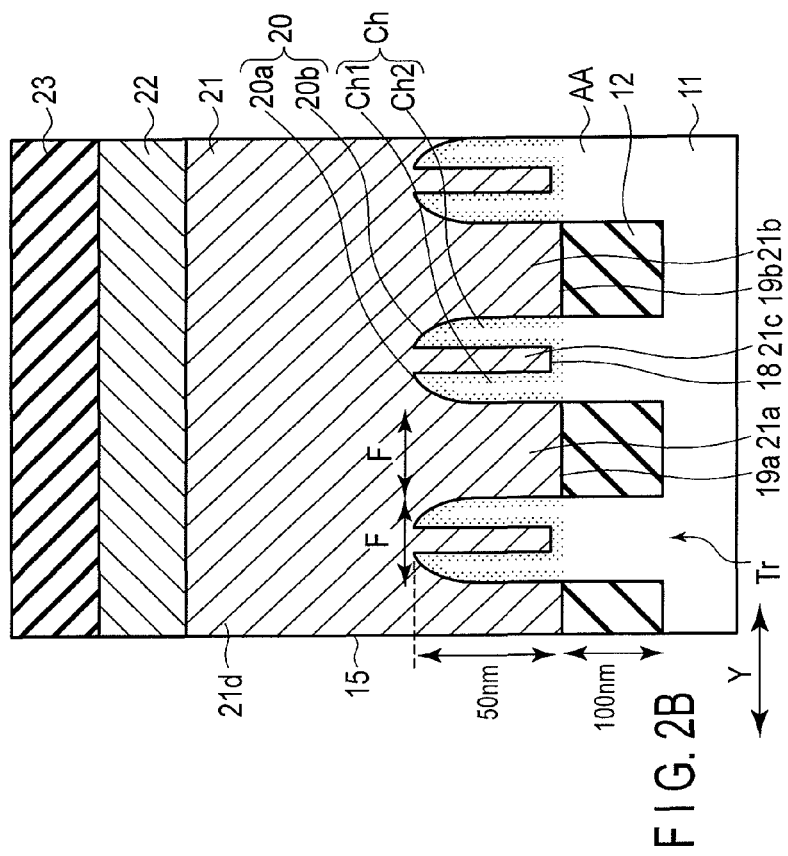
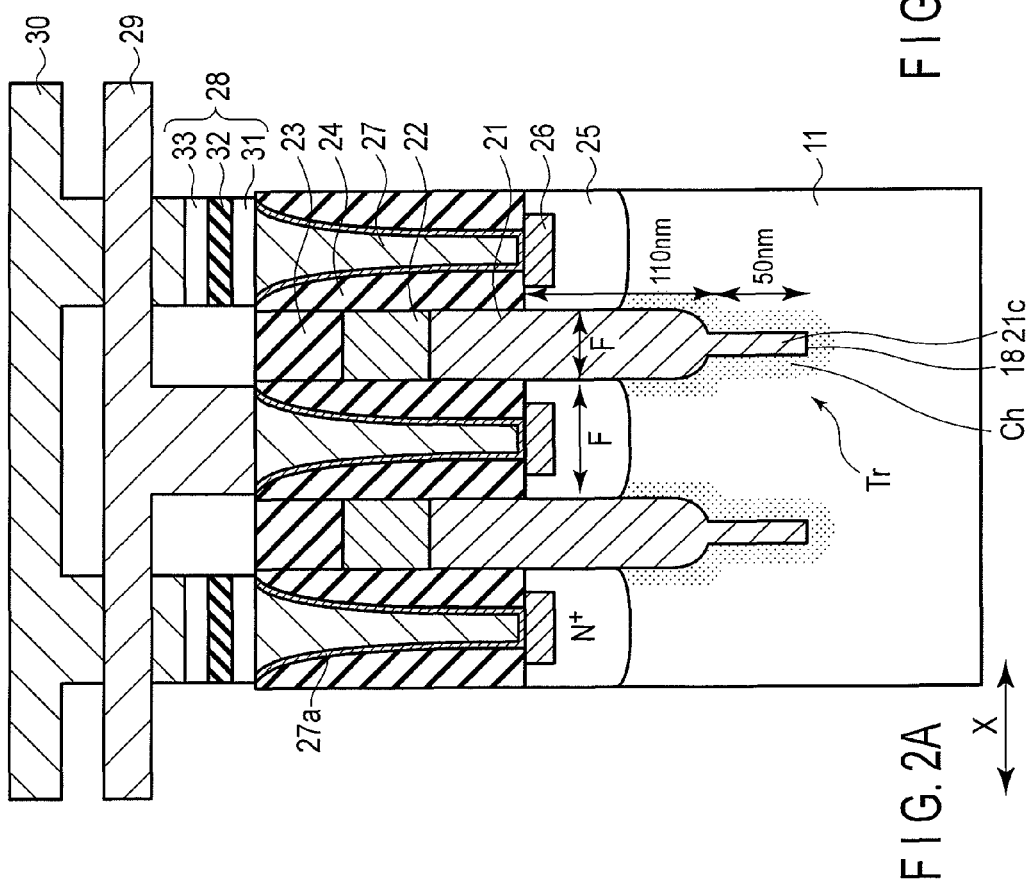
F I G. 2A
F I G. 2B

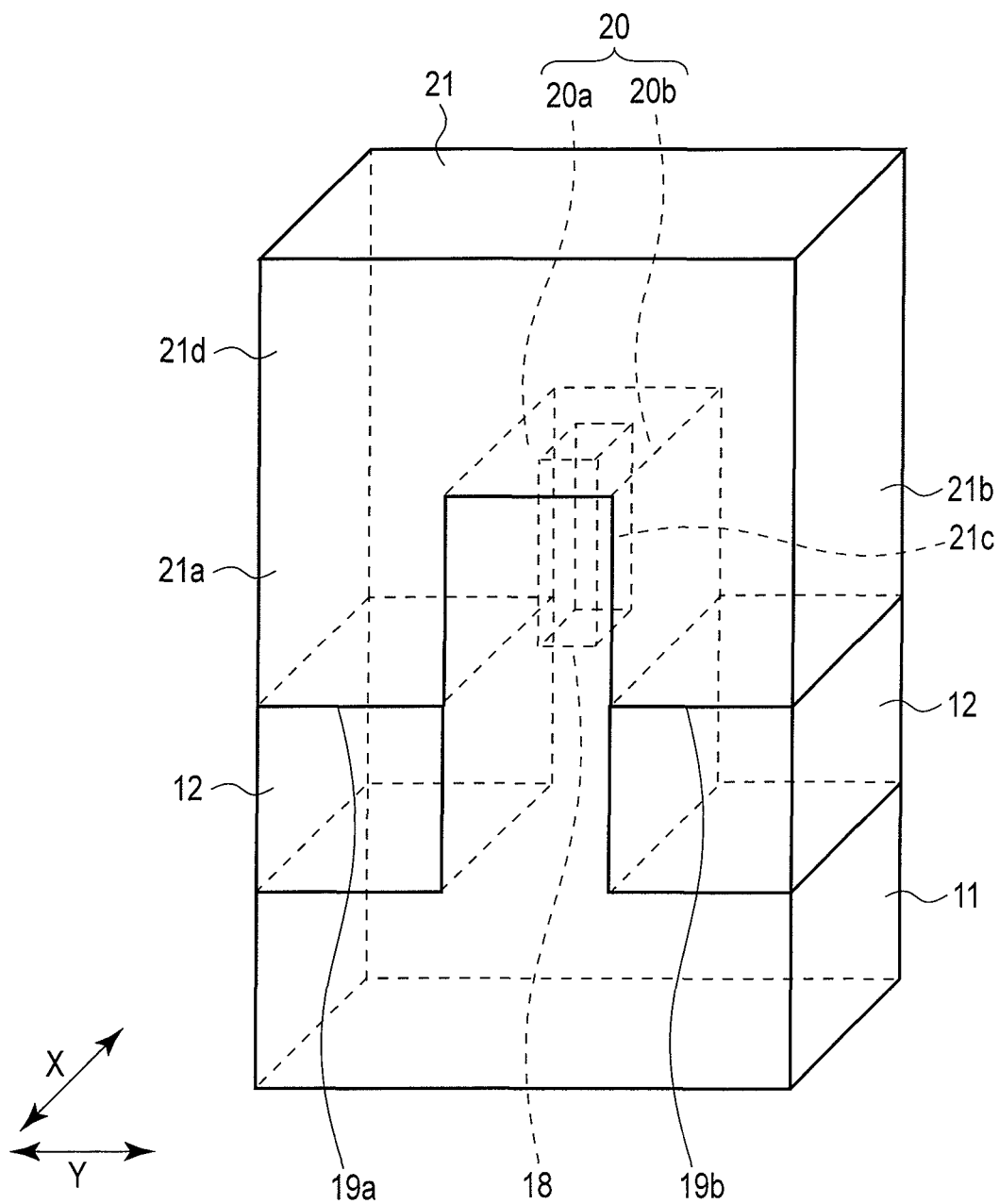
F I G. 3

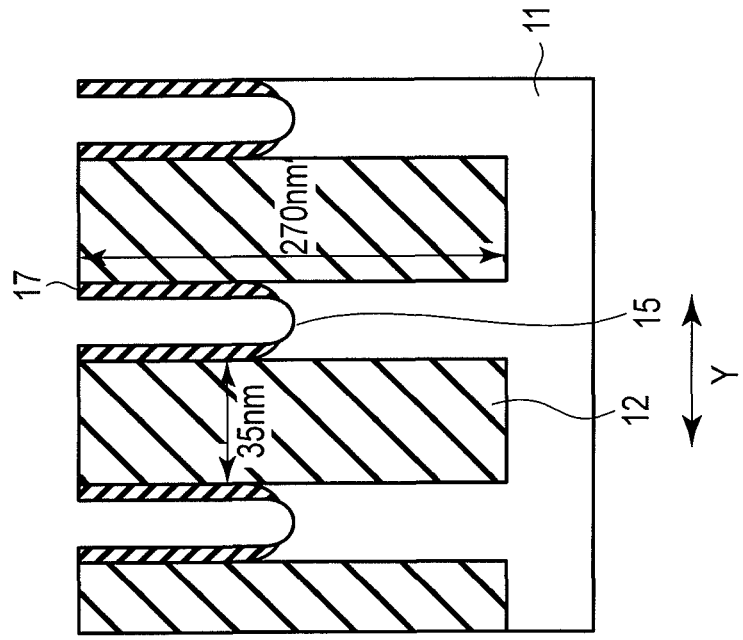
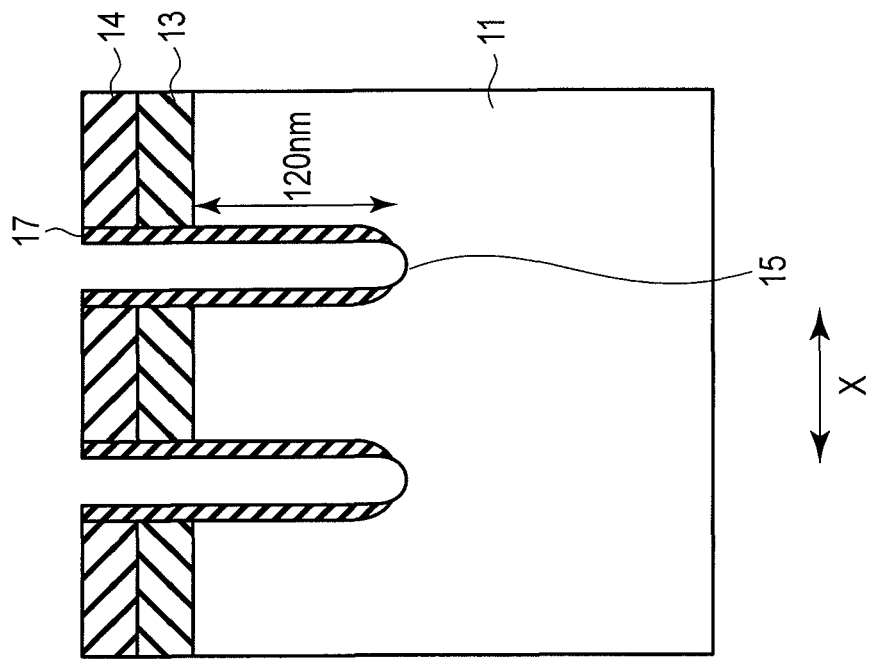
FIG. 6A
FIG. 6B

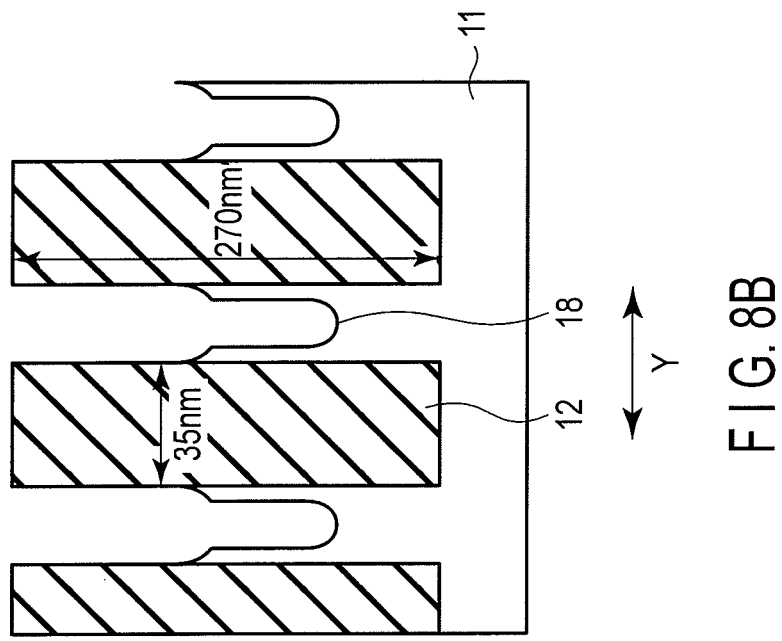
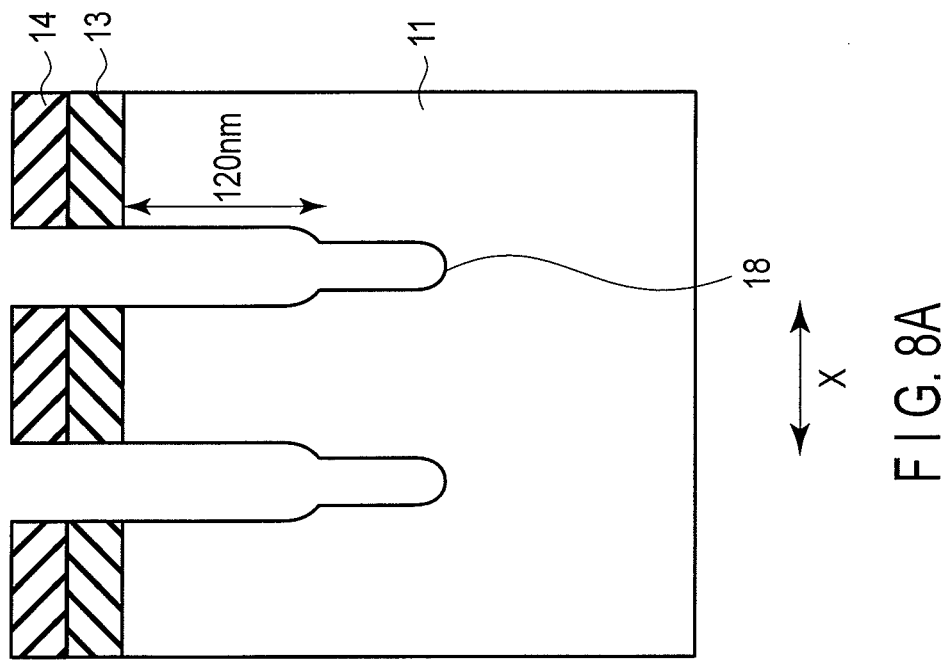
FIG. 8A
FIG. 8B

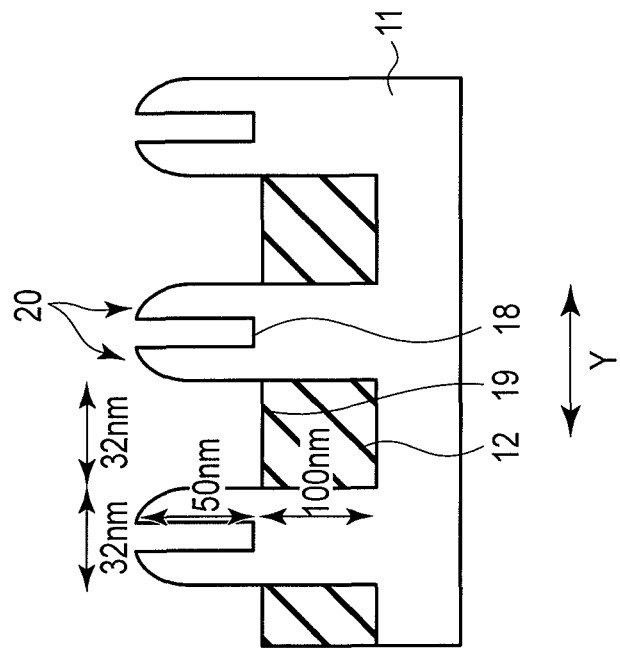
F I G. 9B
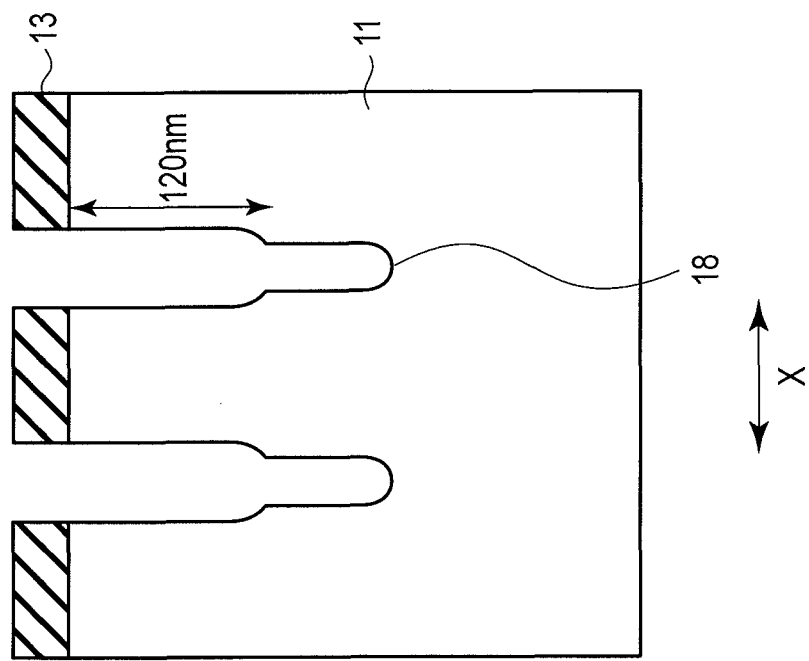
F I G. 9A

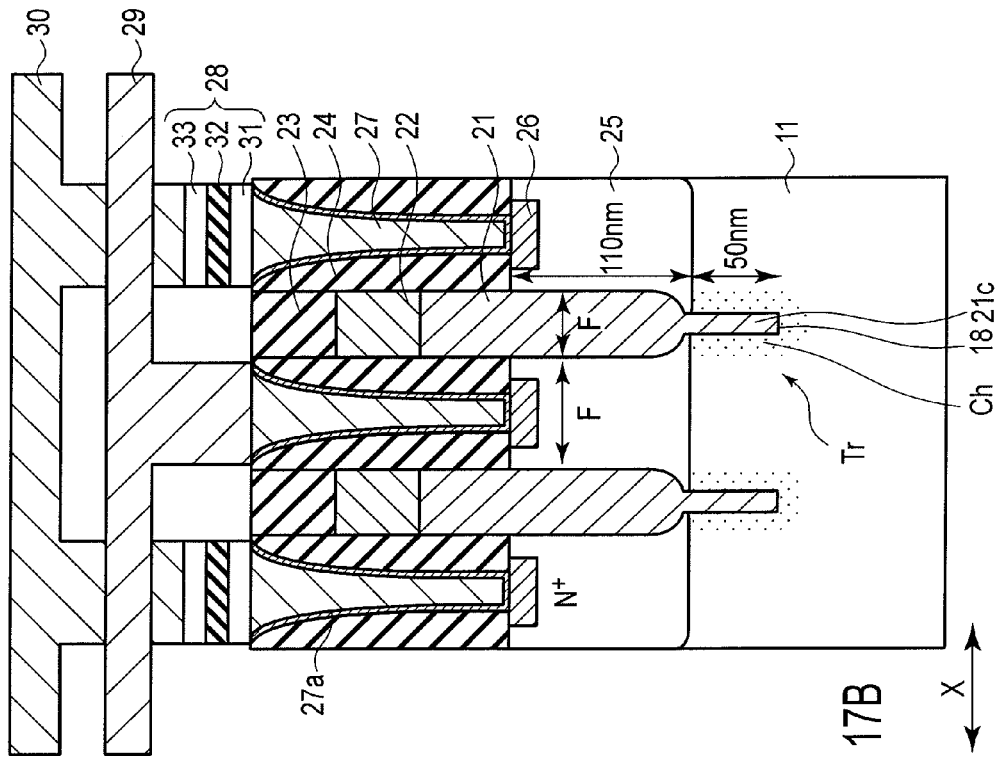
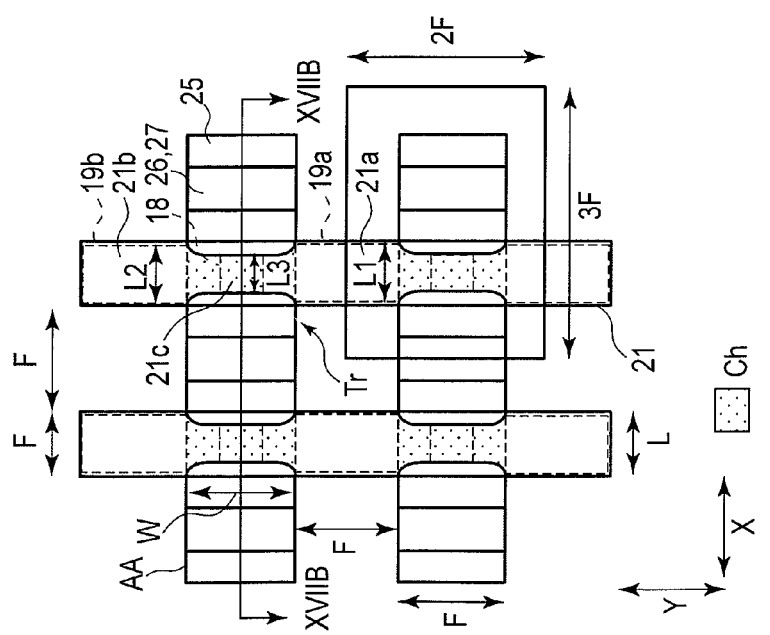
FIG. 17A
FIG. 17B

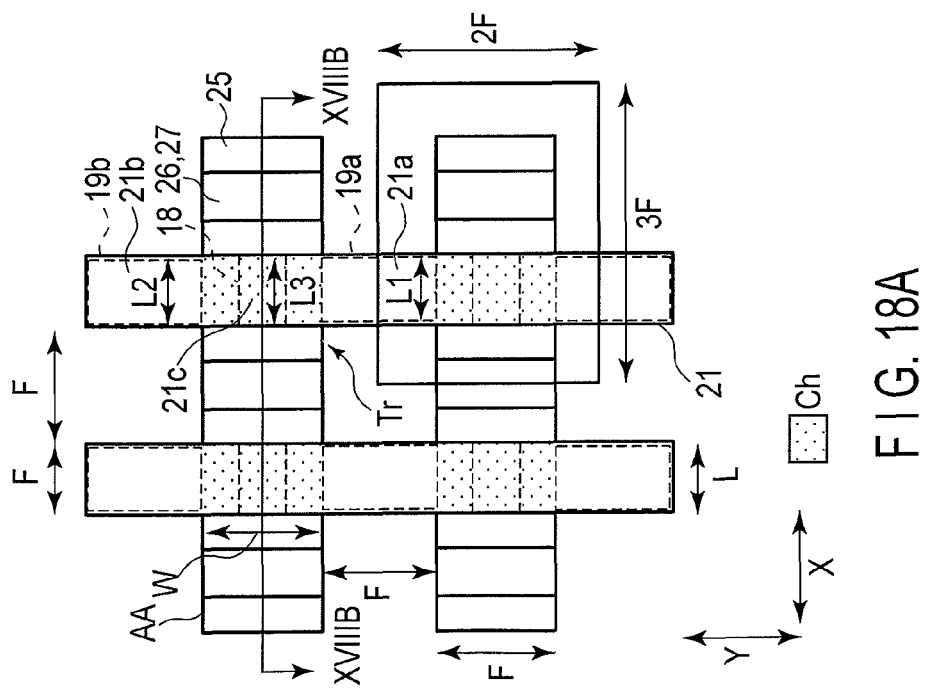
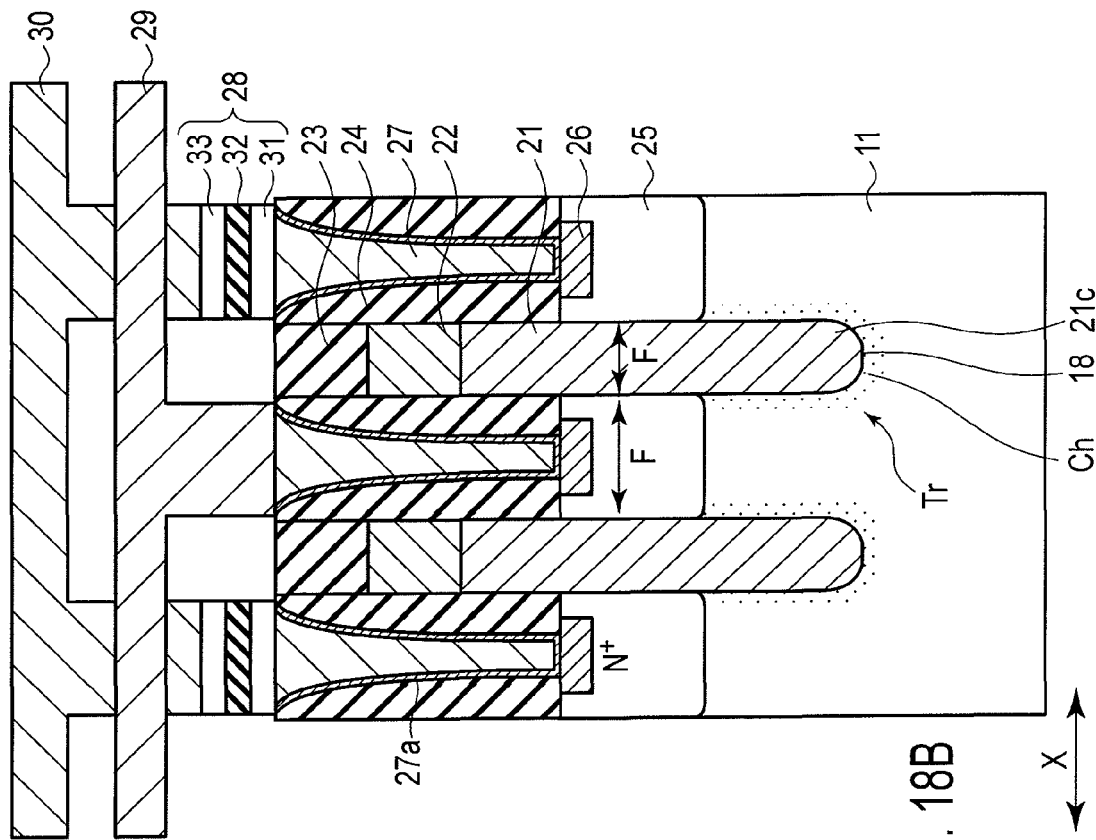
F I G. 18A
F I G. 18B

MULTIPLE CHANNEL FIN-FET AND ITS MANUFACTURING METHOD

CROSS-REFERENCE TO RELATED APPLICATIONS

This application is based upon and claims the benefit of priority from prior Japanese Patent Application No. 2011-070794, filed Mar. 28, 2011, the entire contents of which are incorporated herein by reference.

FIELD

Embodiments described herein relate generally to a semiconductor memory device having a cell transistor and its manufacturing method.

BACKGROUND

In recent years, along with miniaturization of RAM, short channel effects and 3D transistors have been used as cell transistors. However, resistive random access memories such as a resistive random access memory (ReRAM), magnetic random access memory (MRAM) and phase-change random access memory (PRAM), which further require an ensured cell current and a cell (invert) current, require a further increase in cell current.

BRIEF DESCRIPTION OF THE DRAWINGS

FIG. 2A is a cross-sectional view taken along line IIA-IIA of FIG. 1;

FIG. 2B is a cross-sectional view taken along line IIB-IIB of FIG. 1;

FIG. 3 is a schematic perspective view showing part of the memory cell of the magnetic random access memory according to the first embodiment;

FIG. 6A is a cross-sectional view showing the step of manufacturing the magnetic random access memory according to the first embodiment subsequent to FIG. 5A;

FIG. 6B is a cross-sectional view showing the step of manufacturing the magnetic random access memory according to the first embodiment subsequent to FIG. 5B;

FIG. 8A is a cross-sectional view showing the step of manufacturing the magnetic random access memory according to the first embodiment subsequent to FIG. 7A;

FIG. 8B is a cross-sectional view showing the step of manufacturing the magnetic random access memory according to the first embodiment subsequent to FIG. 7B;

FIG. 9A is a cross-sectional view showing the step of manufacturing the magnetic random access memory according to the first embodiment subsequent to FIG. 8A;

FIG. 9B is a cross-sectional view showing the step of manufacturing the magnetic random access memory according to the first embodiment subsequent to FIG. 8B;

FIG. 17A is a plan view showing a memory cell of a magnetic random access memory according to a third embodiment;

FIG. 17B is a cross-sectional view showing the memory of the magnetic random access memory according to the third embodiment;

FIG. 18A is a plan view showing a memory cell of a magnetic random access memory according to a fourth embodiment; and FIG. 18B is a cross-sectional view showing the memory cell of the magnetic random access memory according to the fourth embodiment.

DETAILED DESCRIPTION

Figure 1:
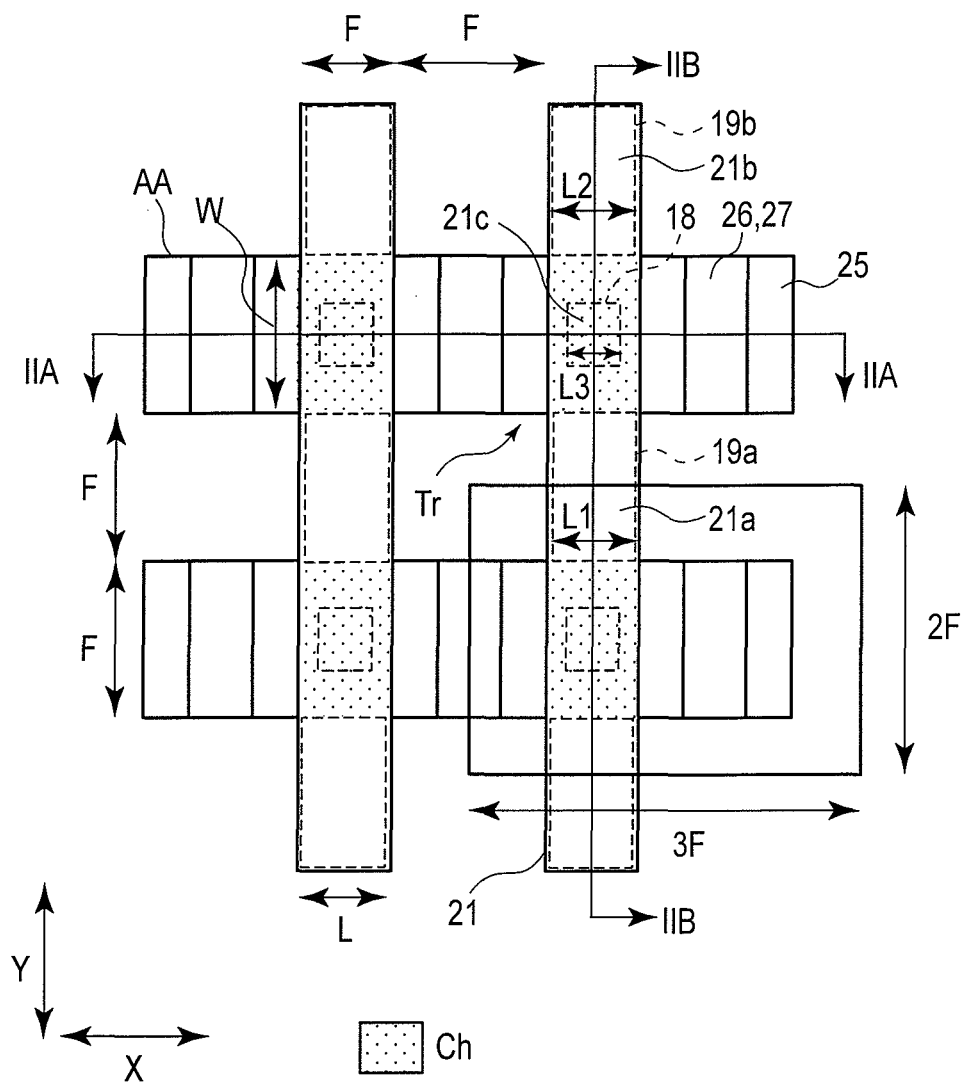
FIG. 1 is a plan view showing a memory cell of a magnetic random access memory according to a first embodiment.

In general, according to one embodiment, a semiconductor memory device a semiconductor memory device includes a semiconductor substrate having a gate groove and first to third grooves, the first to third grooves being formed on a bottom surface of the gate groove and the third groove being formed between the first and second grooves, and a gate electrode having a first gate portion formed in the first groove, a second gate portion formed in the second groove, a third gate portion formed in the third groove, and a fourth gate portion formed in the gate groove. A cell transistor having the gate electrode has a first channel region formed in the semiconductor substrate between the first and third gate portions and a second channel region formed in the semiconductor substrate between the second and third gate portions.

Embodiments will be described below with reference to the drawings. In the description, like reference numerals are denoted to like constituents throughout the drawings. Dimensions, shapes and the like in the drawings are merely convenient and are not limited to illustrated ones.

In the following embodiments, the semiconductor memory device employs a magnetic random access memory (MRAM) but is also applicable to a resistive random access memory such as ReRAM or PRAM.

[1] First Embodiment

In a first embodiment, a transistor in a saddle fin structure is formed between adjacent element isolating regions 12 and a bar-shaped gate electrode 21c is further formed in a saddle-shaped element region.

[1-1] Structure

A memory cell structure of a magnetic random access memory according to the first embodiment will be described with reference to FIGS. 1, 2A, 2B and 3.

[1-1a] Plan view

As shown in FIG. 1, linear element regions (active areas) AA extend in the X-direction and linear gate electrodes 21 extend in the Y-direction. A cell transistor Tr in recess channel array transistor (RCAT) multichannel saddle fin structure is formed on the cross point between the element region AA and the gate electrode 21.

Source/drain diffusion layers 25 of the cell transistor Tr are formed on the element region AA at both ends of the gate electrode 21 and a channel region Ch is formed between the source/drain diffusion layers 25 below the gate electrode 21.

The gate electrode 21 of the cell transistor Tr has first to third gate portions 21a, 21b and 21c projecting toward the semiconductor substrate (toward the back of the sheet). The first and second gate portions 21a and 21b are formed in first and second grooves 19a and 19b, respectively, and the third gate portion 21c is formed in a third groove 18.

The gate length L3 of the third gate electrode 21c is shorter than the gate lengths L1 and L2 of the first and second gate electrodes 21a and 21b. The gate lengths L1 and L2 of the first and second gate electrodes 21a and 21b, the distance between the adjacent gate electrodes 21 in the X-direction, the gate width W of the gate electrode 21 (the width of the element region AA in the Y-direction), and the distance between the adjacent element regions AA in the Y-direction (the width of the element isolating region in the Y-direction) are on the order of a minimum process dimension F. In this example, one cell is on the order of 2F×3F.

As described above, the gate length L (L1, L2) of the cell transistor Tr is F and the gate width W is also F. This is because the minimum process dimension F is defined by L/S (S: gate area) of the forefront lithography. However, in terms of the fin property, a decrease in off-state leakage current during the off state and an increase in current during the on state simultaneously occur in the fully deplete structure. In contrast, in a structure with L=F and W=F, the gate width W is relatively large when Vg=Vcc is applied and thus a channel in the fully deplete state is difficult to form. In order to form the channel, the gate width W relative to the gate length L is desirably at ⅔ or less. The gate width W relative to the gate length L is desirably at ½ or more. This is because a parasitic resistance of the channel has an impact and reversely a decrease in current is caused. From the reasons, in order to form the fin FET structure, the gate width W relative to the gate length L of the cell transistor Tr is desirably between ½ and ⅔.

[1-1b] Cross-Sectional View

As shown in FIG. 2A, the gate electrodes 21 and 22 are formed on the semiconductor substrate 11 via a gate insulating film (not shown) and a hardmask 23 is formed on the gate electrode 22. A sidewall protective film 24 is formed on the sides of the gate electrodes 21 and 22 and the hardmask 23. The source/drain diffusion layers 25 are formed on the surface of the semiconductor substrate 11 and a silicide layer 26 is formed on the surface of the source/drain diffusion layer 25. A magnetic tunnel junction (MTJ) element 28 is connected to one of the source/drain diffusion layers 25 via a conductive layer 27. The MTJ element 28 has a reference layer 31, a storage layer 33 and a tunnel barrier layer 32 formed between the reference layer 31 and the storage layer 33. The layers in the MTJ element 28 may be stacked in a reverse order. A bit line 30 is connected to the MTJ element 28. A source line 29 is connected to the other of the source/drain diffusion layers 25 via the conductive layer 27.

The gate electrode 21 has the third gate portion 21c projecting downward. The channel regions Ch of the cell transistor Tr are formed on the element regions at the side and bottom surfaces of the third gate portion 21c. The bottom surface of the source/drain diffusion layer 25 is positioned above the root of the third gate portion 21c (the uppermost surface of the fin 20 in FIG. 2B).

As shown in FIG. 2B, the semiconductor substrate 11 has a gate groove 15, and first to third grooves 18, 19a and 19b. The first to third grooves 18, 19a and 19b are formed below the bottom surface of the gate groove 15. The first and second grooves 19a and 19b are formed on the element isolating region 12 and the third groove 18 is formed on the element region AA. The first to third grooves 19a, 19b and 18 are alternately arranged in the Y-direction. In other words, within a cell, the third groove 18 is provided between the first and second grooves 19a and 19b. For example, the third groove 18 is positioned at the center between the first and second grooves 19a and 19b.

The gate electrode 21 of the cell transistor Tr has the first to third gate portions 21a, 21b and 21c projecting toward the semiconductor substrate 11, and a fourth gate portion 21d connecting the first to third gate portions 21a, 21b and 21c. The first to fourth gate portions 21a, 21b, 21c and 21d are formed in the first to third grooves 19a, 19b, and 18 and the gate groove 15, respectively. The first to fourth gate portions 21a, 21b, 21c and 21d are continuously formed by the same conductive layer. For example, the third gate portion 21c is positioned at the center between the first and second gate portions 21a and 21b. The bottom surface of the third gate portion 21c may be as high as the bottom surfaces of the first and second gate portions 21a and 21b or may be different therefrom.

At the cross section of FIG. 2B, two fins 20a and 20b projecting upward are present between the adjacent element isolating regions 12. The fin 20a is positioned between the first and third gate portions 21a and 21c, and the fin 20b is positioned between the second and third gate portions 21b and 21c. The fin 20a has a first channel region Ch1 and the fin 20b has a second channel region Ch2. The first channel region Ch1 is formed of a channel part opposite to the first gate portion 21a and a channel part opposite to the third gate portion 21c, and is formed in the element region between the first and third gate portions 21a and 21c. The second channel region Ch2 is formed of a channel part opposite to the second gate portion 21b and a channel part opposite to the third gate portion 21c, and is formed in the element region between the second and third gate portions 21b and 21c.

In the embodiment, the transistor Tr is formed in the recess gate structure in which the gate is formed in the recessed element region AA in the direction (X-direction) orthogonal to the extending direction of the gate electrode 21 while the transistor Tr is formed in the saddle fin structure in which the gate electrode 21 (the first and second gate portions 21a and 21b) surrounds the element region AA in the extending direction (Y-direction) of the gate electrode 21. The bar-shaped third gate electrode 21c is further formed in the saddle-shaped element region AA between the adjacent element isolating regions 12 (the first and second gate portions 21a and 21b). Thus, at the cross section of FIG. 2B, two saddle-shaped steric channel regions are on the ends of the element isolating regions 12 and two channel regions are along the third gate portion 21c so that a current path made of a total of four steric channel regions occurs. Thus, since the number of channels is twice as large as that in the typical saddle-shaped fin transistor, a twofold increase in current can be simply allowed.

[1-1c] Perspective View

As shown in FIG. 3, the semiconductor substrate 11 has the fin 20 projecting upward from the top surface of the element isolating region 12. The fin 20 has a tube shape around the third gate portion 21c.

[1-2] Manufacturing Method

A method of manufacturing the memory cell of the magnetic random access memory according to the first embodiment will be described with reference to FIGS. 2A, 2B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A and 15B.

Figure 4B:
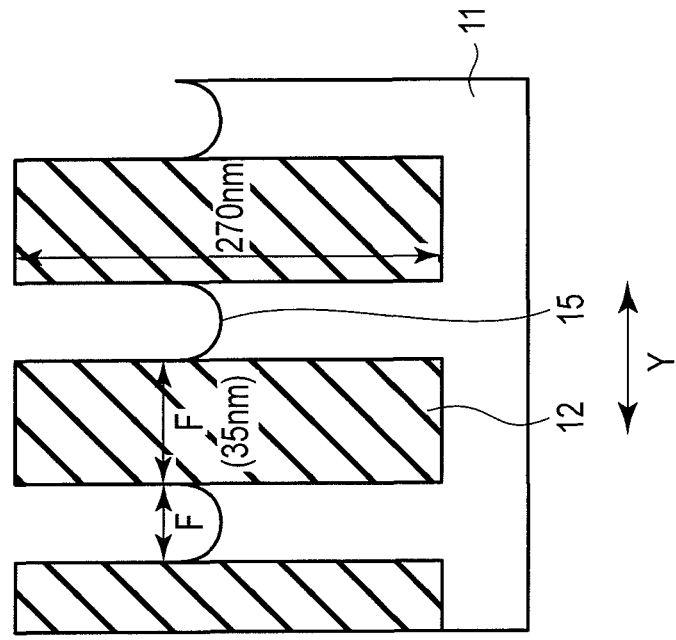
FIG. 4B is a cross-sectional view showing the step of manufacturing the magnetic random access memory according to the first embodiment.
Figure 4A:
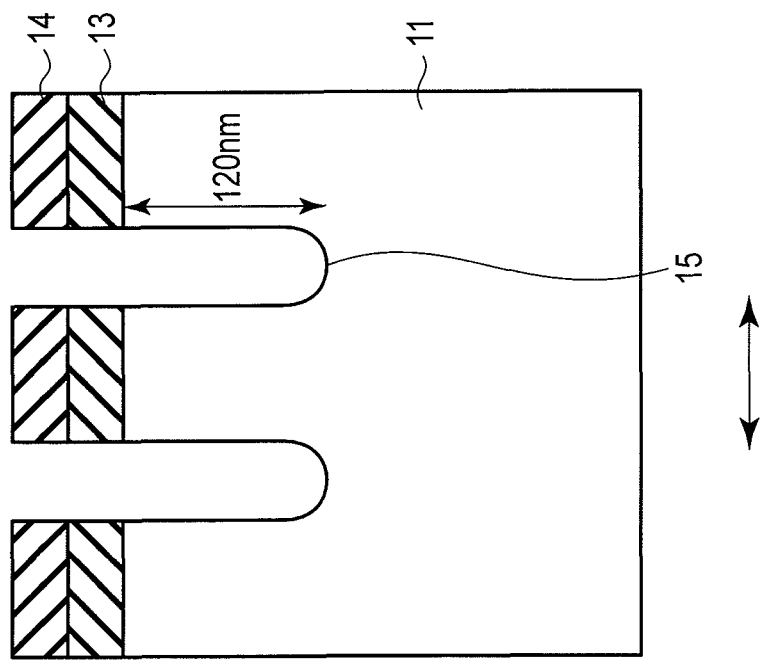
FIG. 4A is a cross-sectional view showing a step of manufacturing the magnetic random access memory according to the first embodiment.

As shown in FIGS. 4A and 4B, a typical process is used to form the element isolating region (element isolation insulating film) 12 in a shallow trench isolation (STI) structure in the semiconductor substrate (such as a silicon substrate) 11. The depth of the element isolating region 12 is 270 nm, for example. The width of the element isolating region 12 and the distance between the adjacent element isolating regions 12 are the minimum process dimension F, for example. The minimum process dimension is 35 nm, for example.

Then, mask materials such as an SiN film 13 and a tetraethyl orthosilicate (TEOS) film 14 are sequentially formed on the semiconductor substrate 11. Then, the SiN film 13 and the TEOS film 14 are patterned by lithography. The pattern is a reverse line pattern to the shape of the gate electrode 21 of FIG. 1. In other words, during the patterning, the SiN film 13 and the TEOS film 14 on the element isolation region 12 are removed (FIG. 4B). The exposed semiconductor substrate 11 is removed by use of the patterned SiN film 13 and TEOS film 14. Thereby, the gate groove 15 is formed in the semiconductor substrate 11. The gate groove 15 is formed in a gap (the semiconductor substrate 11) between the adjacent element isolating regions 12 at the cross section of FIG. 4B. The depth of the gate groove 15 from the top surface of the semiconductor substrate 11 is 120 nm, for example.

Figure 5B:
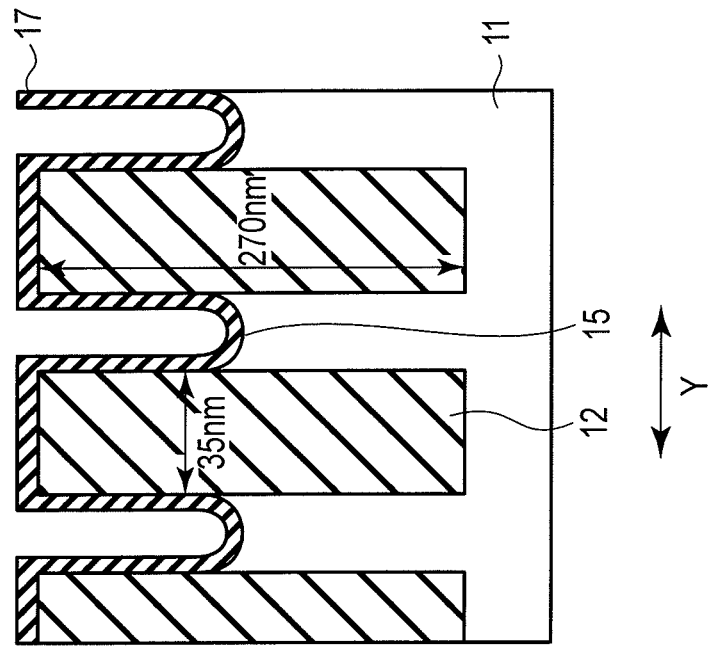
FIG. 5B is a cross-sectional view showing the step of manufacturing the magnetic random access memory according to the first embodiment subsequent to FIG. 4B.
Figure 5A:
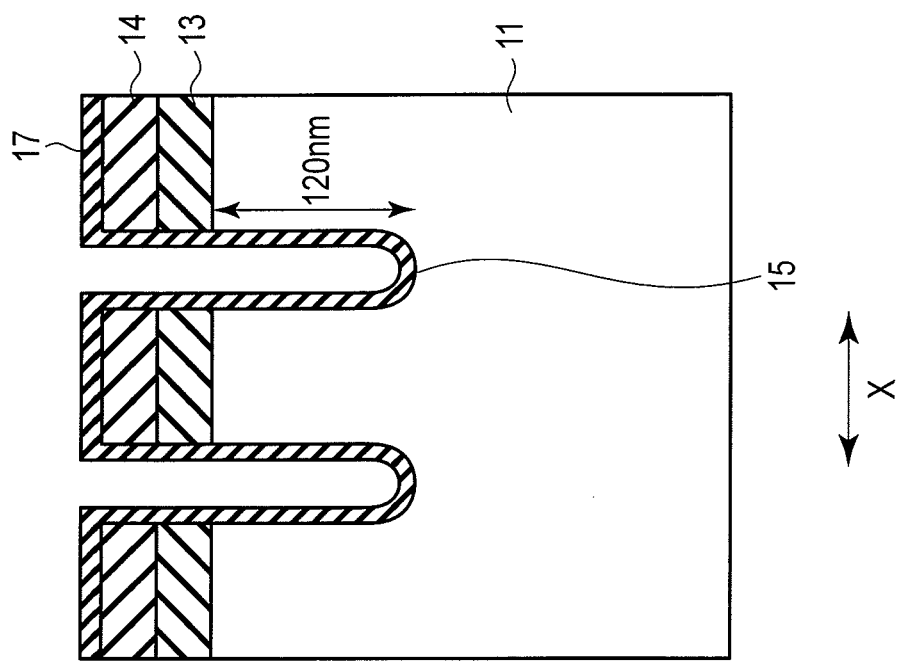
FIG. 5A is a cross-sectional view showing the step of manufacturing the magnetic random access memory according to the first embodiment subsequent to FIG. 4A.

Then, as shown in FIGS. 5A and 5B, a film 17 is formed in the gate groove 15 and on the TEOS film 14 and the element isolating region 12. The film 17 is desirably an insulating film (such as a thermal oxide film) of the element isolating region 12 or a selectively-removable film such as boron silicate glass (BSG) in the steps of FIGS. 8A and 8B described later. The film thickness of the film 17 is desirably adapted to a desired width of the fin 20 in order to define the width of the fin 20 to be formed in the steps of FIGS. 9A and 9B described later.

Then, as shown in FIGS. 6A and 6B, the film 17 is selectively removed by reactive ion etching (RIE). Thereby, the top surface of the TEOS film 14 and the bottom surface of the gate groove 15 are exposed.

Figure 7B:
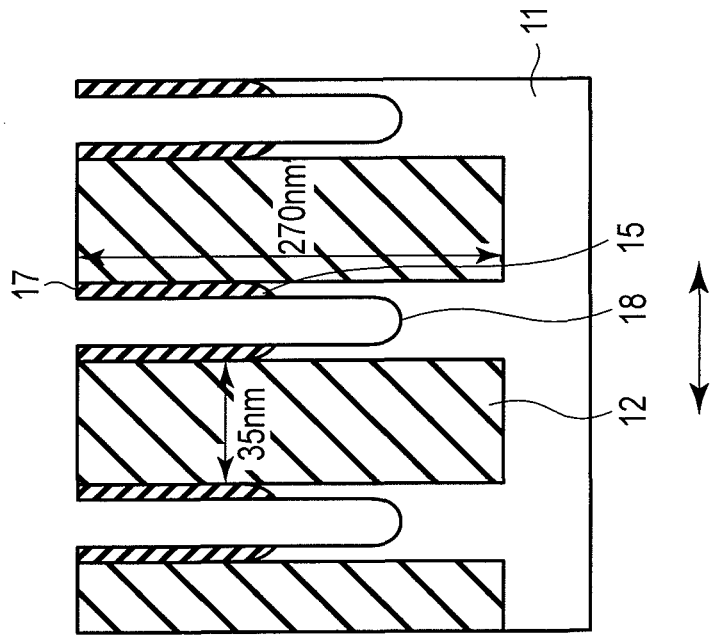
FIG. 7B is a cross-sectional view showing the step of manufacturing the magnetic random access memory according to the first embodiment subsequent to FIG. 6B.
Figure 7A:
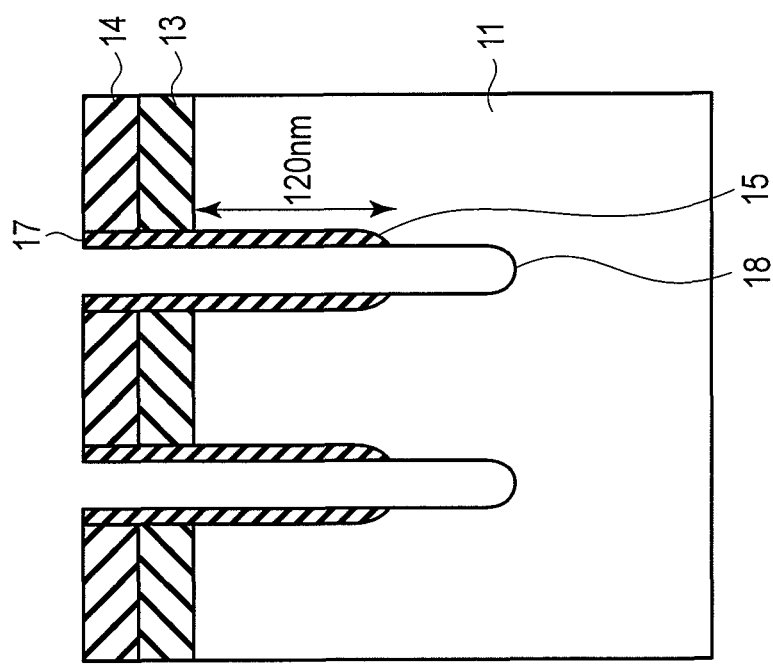
FIG. 7A is a cross-sectional view showing the step of manufacturing the magnetic random access memory according to the first embodiment subsequent to FIG. 6A.

Then, as shown in FIGS. 7A and 7B, the semiconductor substrate 11 at the bottom surface of the gate groove 15 is etched to a desired fin depth (such as 50 nm) with the TEOS film 14 and the film 17 as masks. Thereby, a groove 18 is formed below the bottom surface of the gate groove 15.

As shown in FIGS. 8A and 8B, the film 17 is selectively removed by vapor hydrofluoric acid or the like.

As shown in FIGS. 9A and 9B, $SiO_2$/RIE is performed to recess the TEOS film 14 and the element isolating region 12 as exposed oxide films. Thereby, a groove 19 is formed on the element isolating region 12 and the fin 20 is formed around the groove 18. The height of the element isolating region 12 is lowered by a desired height of the fin 20. For example, the height of the fin 20 is 50 nm and the height of the element isolating region 12 is 100 nm. The distance between the element regions (the width of the element isolation insulating film 12 in the Y-direction) and the width of the element region in the Y-direction (the distance between the element isolation insulating films 12) are each 32 nm, for example.

Figure 10B:
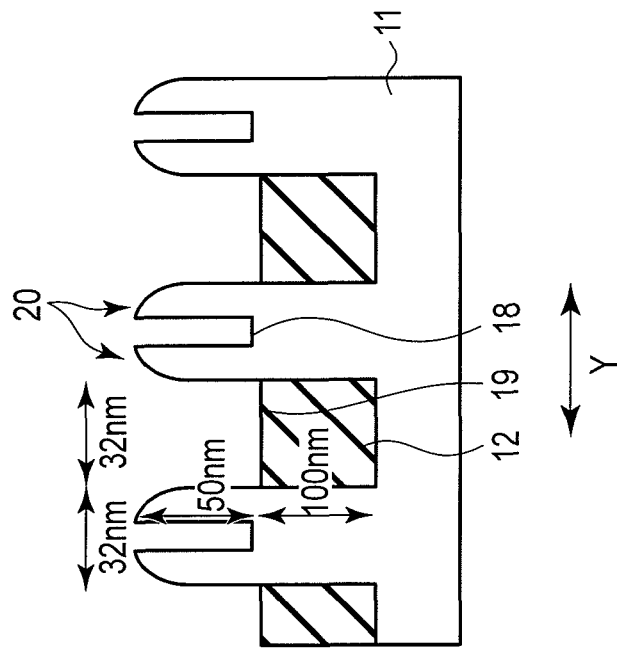
FIG. 10B is a cross-sectional view showing the step of manufacturing the magnetic random access memory according to the first embodiment subsequent to FIG. 9B.
Figure 10A:
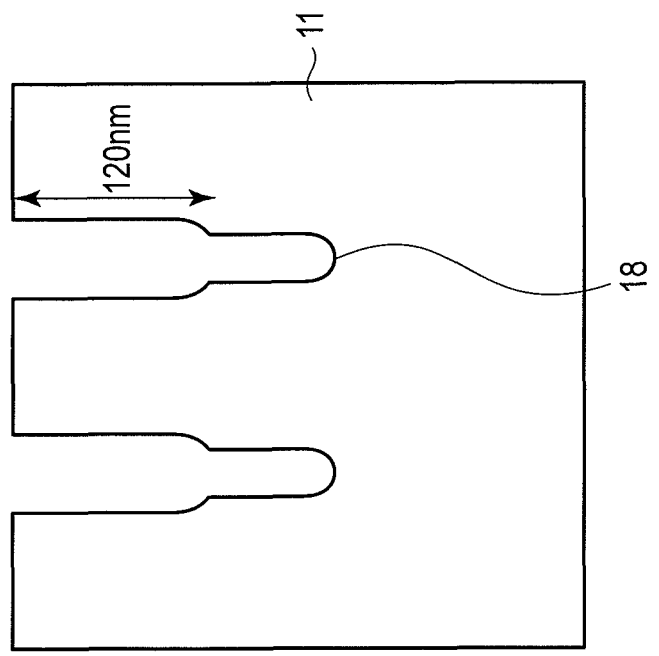
FIG. 10A is a cross-sectional view showing the step of manufacturing the magnetic random access memory according to the first embodiment subsequent to FIG. 9A.

As shown in FIGS. 10A and 10B, the SiN film 13 is removed and the top surface of the semiconductor substrate 11 is exposed.

Figure 11B:
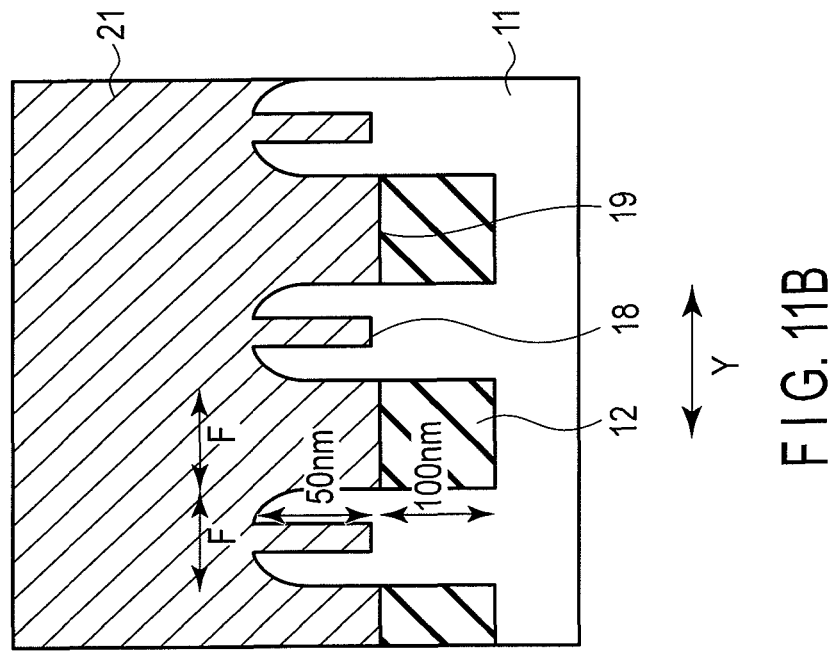
FIG. 11B is a cross-sectional view showing the step of manufacturing the magnetic random access memory according to the first embodiment subsequent to FIG. 10B.
Figure 11A:
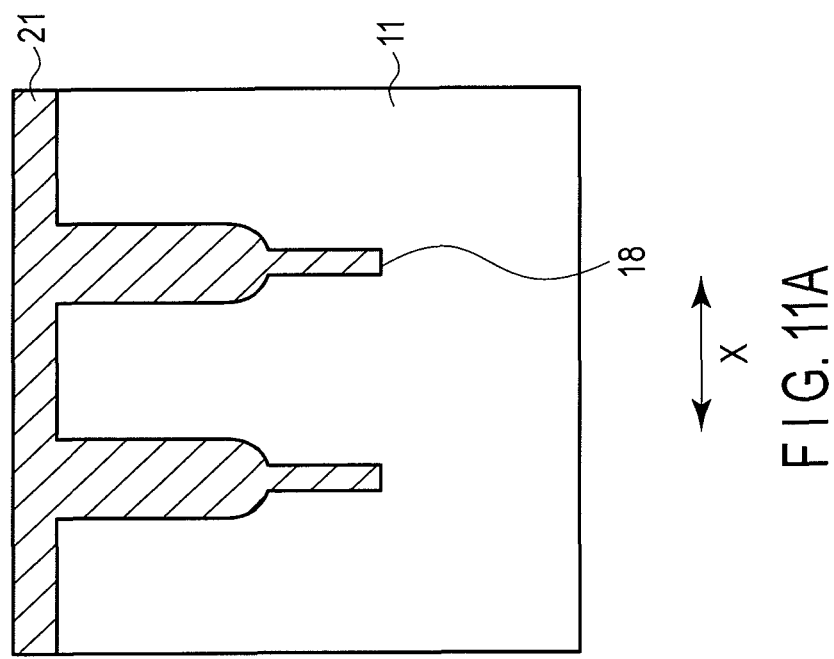
FIG. 11A is a cross-sectional view showing the step of manufacturing the magnetic random access memory according to the first embodiment subsequent to FIG. 10A.

As shown in FIGS. 11A and 11B, a gate oxide film (not shown) is formed and then the gate electrode 21 made of, for example, polysilicon is formed by chemical vapor deposition (CVD). Thereby, the grooves 18 and 19 are embedded by the gate electrode 21. Thereafter, though not illustrated, $N^+$ impurities are introduced into the polysilicon by ion implantation after PEP. At this time, $N^+$ and $P^+$ impurities are introduced into an N channel transistor and a P channel transistor in the peripheral circuit, respectively.

Figure 12B:
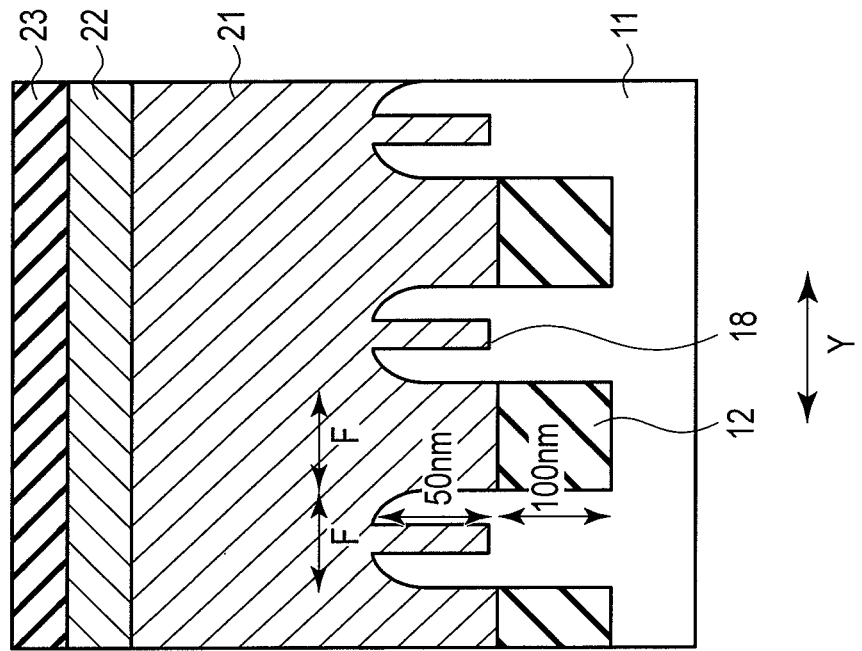
FIG. 12B is a cross-sectional view showing the step of manufacturing the magnetic random access memory according to the first embodiment subsequent to FIG. 11B.
Figure 12A:
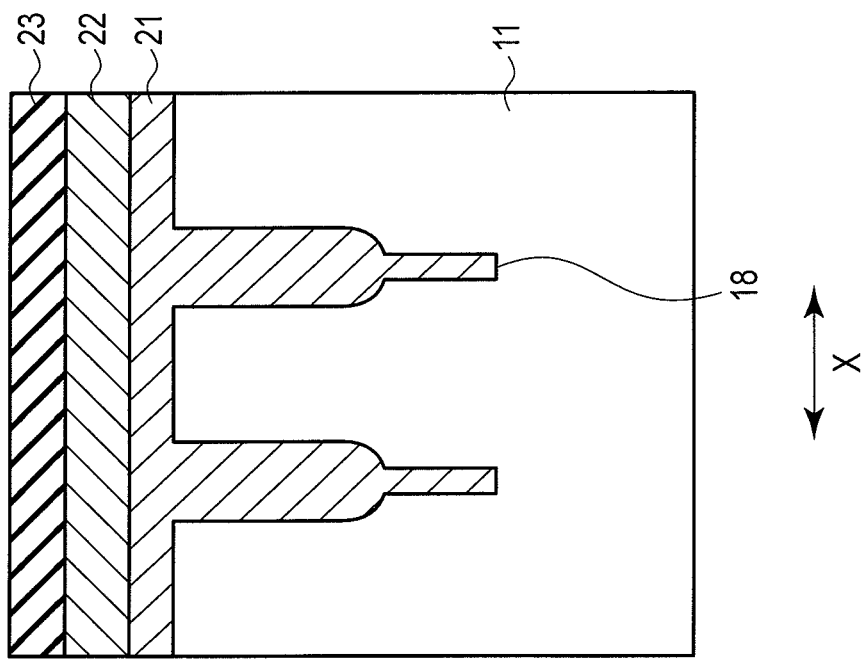
FIG. 12A is a cross-sectional view showing the step of manufacturing the magnetic random access memory according to the first embodiment subsequent to FIG. 11A.

Then, as shown in FIGS. 12A and 12B, the gate electrode 22 made of metal is formed on the gate electrode 21 by WNx sputtering and W-CVD after activation annealing. The hardmask 23 made of CVD-SiN is deposited on the gate electrode 22.

Figure 13B:
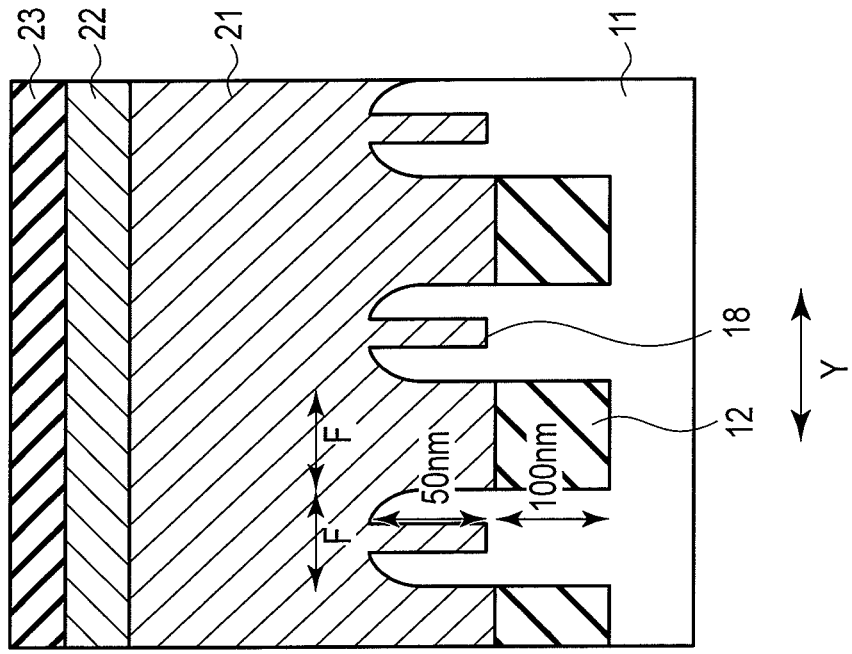
FIG. 13B is a cross-sectional view showing the step of manufacturing the magnetic random access memory according to the first embodiment subsequent to FIG. 12B.
Figure 13A:
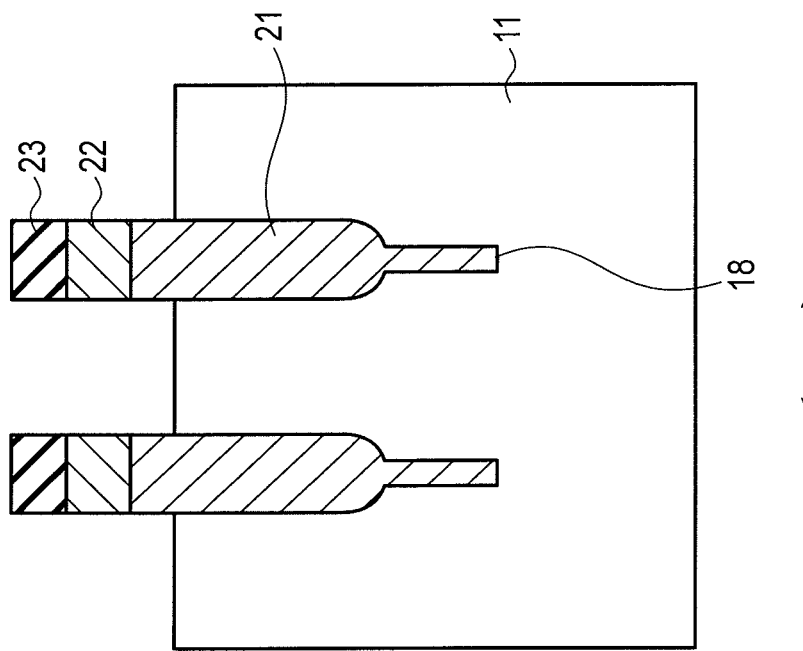
FIG. 13A is a cross-sectional view showing the step of manufacturing the magnetic random access memory according to the first embodiment subsequent to FIG. 12A.

As shown in FIGS. 13A and 13B, the lithography method is used to pattern the gate electrodes 21 and 22 and the hardmask 23 by remaining the gate pattern.

Figure 14B:
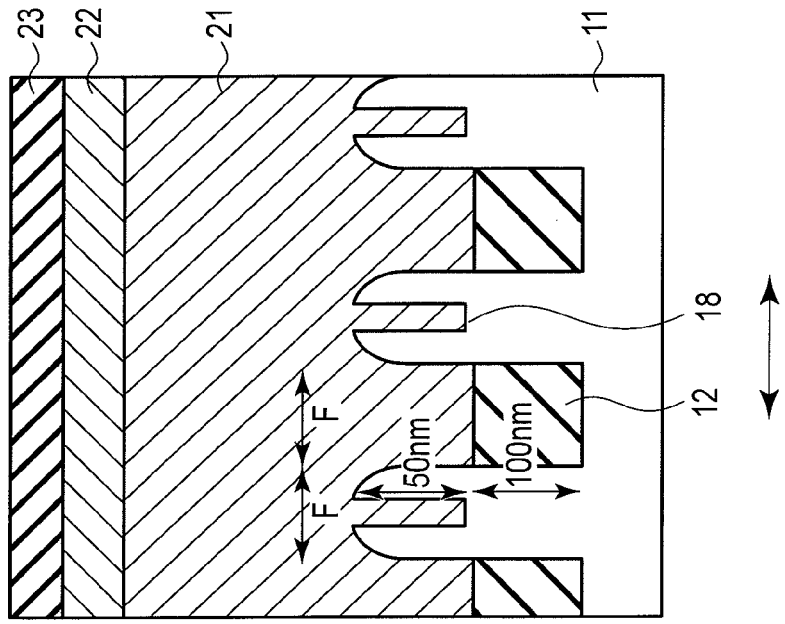
FIG. 14B is a cross-sectional view showing the step of manufacturing the magnetic random access memory according to the first embodiment subsequent to FIG. 13B.
Figure 14A:
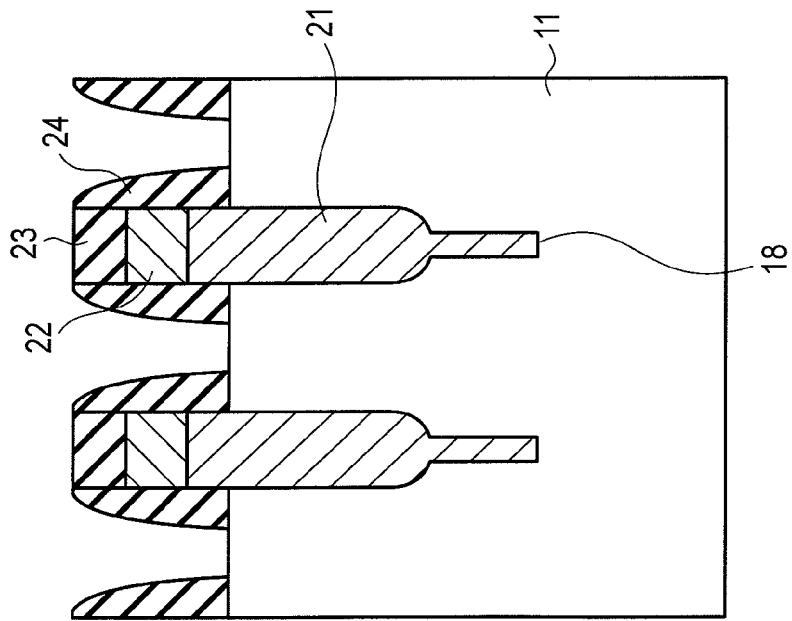
FIG. 14A is a cross-sectional view showing the step of manufacturing the magnetic random access memory according to the first embodiment subsequent to FIG. 13A.

As shown in FIGS. 14A and 14B, the CVD-SiN film is deposited and the sidewall protective film 24 made of the SiN film is formed on the sidewalls of the gate electrodes 21 and 22 and the hardmask 23 by anisotropic etching.

Figure 15A:
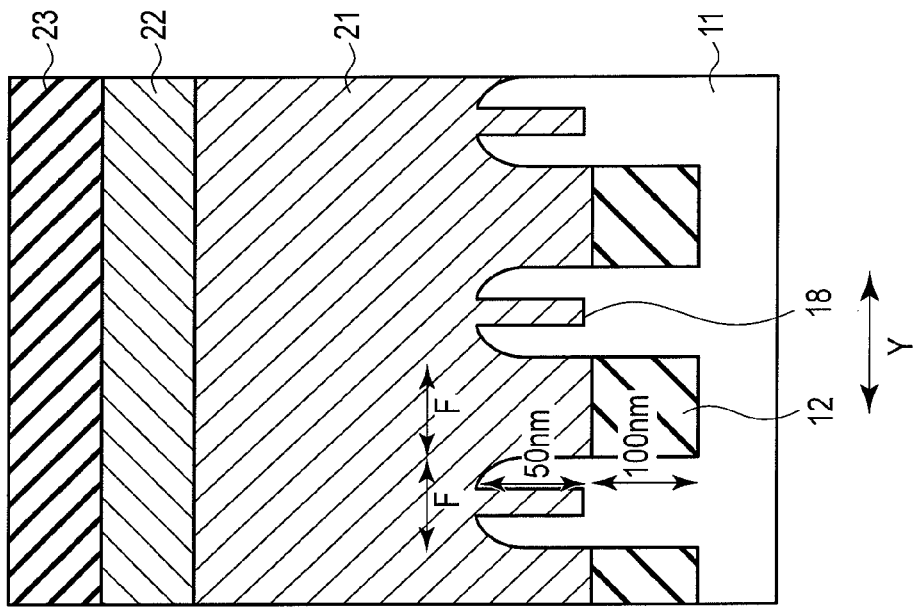
FIG. 15A is a cross-sectional view showing the step of manufacturing the magnetic random access memory according to the first embodiment subsequent to FIG. 14A.
Figure 15B:
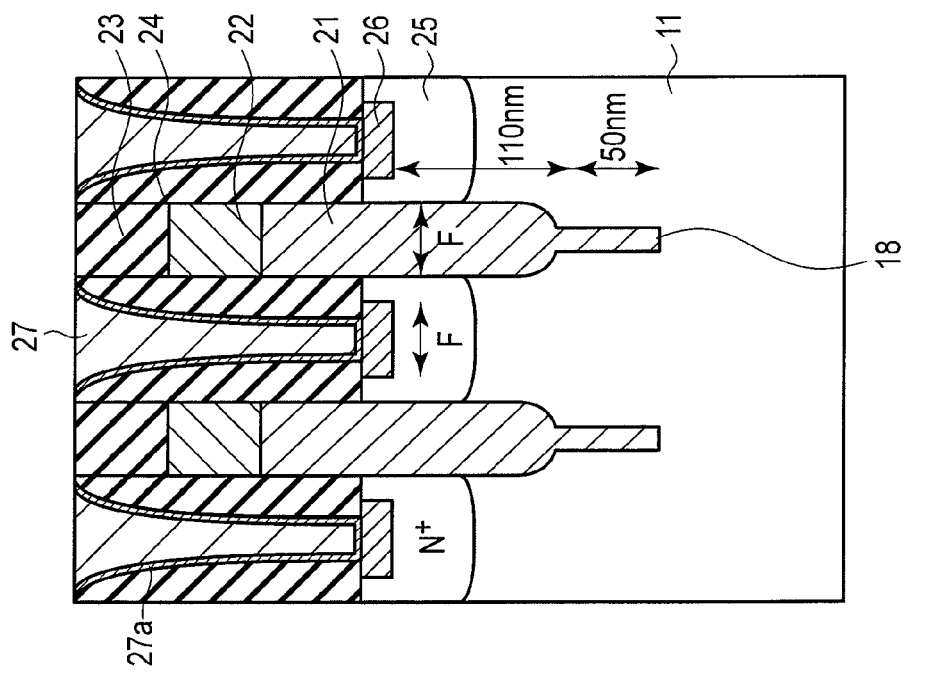
FIG. 15B is a cross-sectional view showing the step of manufacturing the magnetic random access memory according to the first embodiment subsequent to FIG. 14B.

As shown in FIGS. 15A and 15B, the source/drain diffusion layers 25 are formed on the surface of the semiconductor substrate 11. Then, an insulating layer with high filling performance (not shown) as gate gap filling film is deposited and flattened between the adjacent gate electrodes 21 and 22. Thereafter, the insulating layer is etched in a self-alignment manner by etching with a selective ratio with the sidewall protective film 24, thereby forming a contact hole. At a temperature of about 600° C., a barrier metal film 27a made of, for example, Ti/TiN is formed on the side and bottom surfaces of the contact hole by sputtering. The silicide layer 26 is formed on the surface of the source/drain diffusion layer 25 at the bottom of the contact hole contacting with Si. Thereafter, the contact hole is embedded by the conductive layer 27.

Then, as shown in FIGS. 2A and 2B, the MTJ element 28 connected to one of the source/drain diffusion layers 25, the source line 29 connected to the other of the source/drain diffusion layers 25, and the bit line 30 connected to the MTJ device are formed. Thereafter, an interconnect and the like are formed by a typical process, a memory cell array is formed, and consequently the multichannel saddle fin structure is formed.

[1-3] Effects

According to the first embodiment, the channel width of the fin 20 can be controlled depending on the thickness of the deposited film 17 (FIGS. 7B, 8A, 8B, 9A and 9B). Therefore, in the present embodiment, the channel width of the fin 20 can be decided not depending on the minimum process dimension F of the lithography unlike conventionally, and the gate width W relative to the gate length L can be set at ½ to ⅔.

Further, in the first embodiment, the third gate portion 21c is formed in the element region between the first and second gate portions 21a and 21b. Thus, the fins 20a and 20b are formed between the first and third gate portions 21a and 21c, and between the second and third gate portions 21b and 21c, respectively. Thereby, the channel region Ch can be twice as large as that in the conventional saddle fin structure, thereby increasing an on-state current through the cell.

As described above, according to the first embodiment, the on-state current through the cell can be ensured while achieving the miniaturization of the memory cell.

[2] Second Embodiment

In a second embodiment, a source/drain diffusion layer 25 is formed deeper in the substrate than in the first embodiment.

A structure of a memory cell of a magnetic random access memory according to the second embodiment will be described with reference to FIGS. 16A and 16B. For the description, the same points as the first embodiment will be omitted.

Figure 16B:
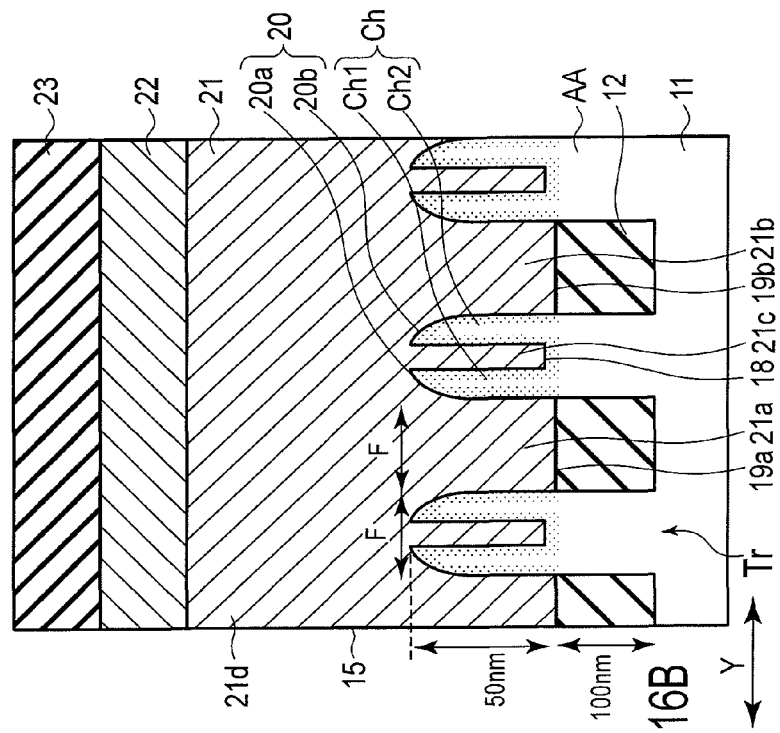
FIG. 16B is a cross-sectional view showing the memory cell of the magnetic random access memory according to the second embodiment.
Figure 16A:
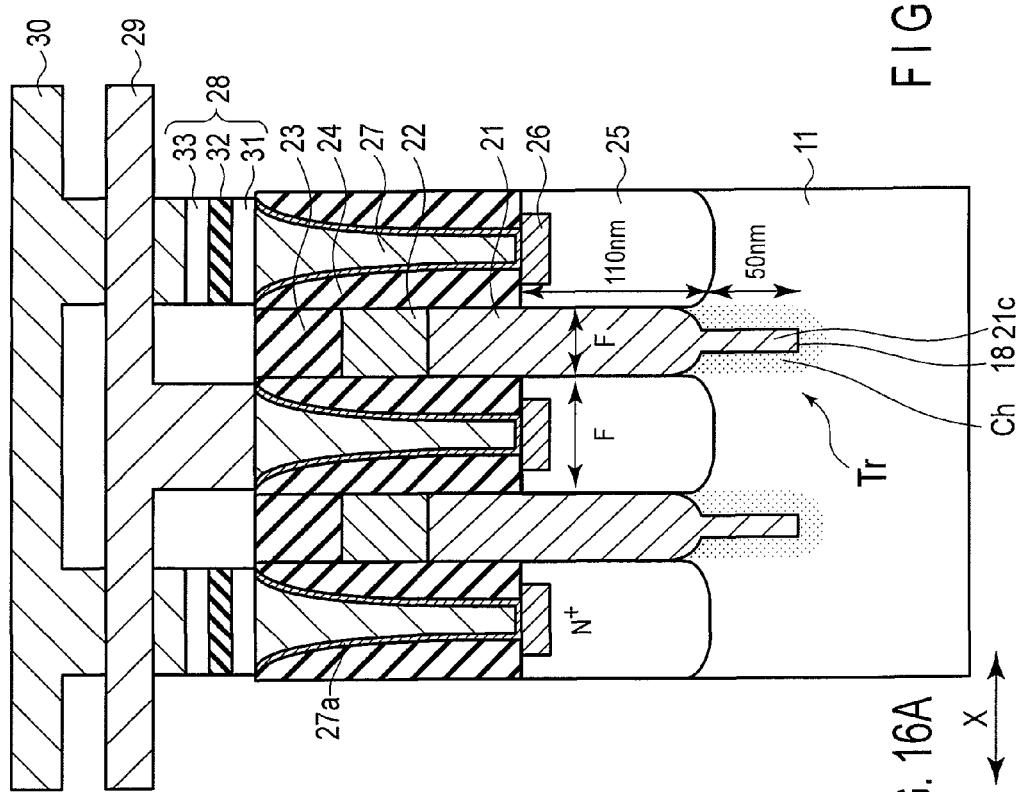
FIG. 16A is a cross-sectional view showing a memory cell of a magnetic random access memory according to a second embodiment.

As shown in FIGS. 16A and 16B, the second embodiment is different from the first embodiment in that the bottom surface of the source/drain diffusion layer 25 is positioned below the root of a third gate portion 21c (the uppermost surface of a fin 20).

According to the second embodiment, similar effects to the first embodiment can be obtained. Furthermore, in the second embodiment, the source/drain diffusion layer 25 is formed deeper than the root of the third gate portion 21c. Thereby, an on-state current can contribute not only to the upper end of the fin 20 but also in the depth direction of a fin transistor and thus the current contribution of a cell transistor Tr is increased.

[3] Third Embodiment

In a third embodiment, a source/drain diffusion layer 25 is spread to enter below a gate electrode 21.

A structure of a memory cell of a magnetic random access memory according to the third embodiment will be described with reference to FIGS. 17A and 17B. For the description, the same points as the second embodiment will be omitted. The cross-sectional view in the Y-direction is the same as that in the second embodiment.

As shown in FIGS. 17A and 17B, the third embodiment is different from the second embodiment in that the source/drain diffusion layer 25 is extended close to a third gate portion 21c below the gate electrode 21 and the source/drain diffusion layer 25 contacts the side surface of the third gate portion 21c.

According to the third embodiment, similar effects to the second embodiment can be obtained. Further, according to the third embodiment, the source/drain diffusion layer 25 is extended in the horizontal direction to contact the side surface of the third gate portion 21c. Thereby, a fin 20 and the source/drain diffusion layer 25 are largely overlapped and a current path is increased so that an increase in on-state current can be further expected.

[4] Fourth Embodiment

In a fourth embodiment, the gate length L3 of a third gate portion 21c of a gate electrode 21 is the same as the gate lengths L1 and L2 of first and second gate portions 21a and 21b.

A structure of a memory cell of a magnetic random access memory according to the fourth embodiment will be described with reference to FIGS. 18A and 18B. For the description, the same points as the first embodiment will be omitted. The cross-sectional view in the Y-direction is the same as that in the first embodiment.

As shown in FIGS. 18A and 18B, the fourth embodiment is different from the first embodiment in that the gate length L3 of the third gate portion 21c of the gate electrode 21 is equal to the gate lengths L1 and L2 of the first and second gate portions 21a and 21b.

According to the fourth embodiment, similar effects to the first embodiment can be obtained. Further, since the gate length L3 of the third gate portion 21c is equal to the gate lengths L1 and L2 of the first and second gate portions 21a and 21b, the fourth embodiment has an effect that coverage and uniformity of electrolysis effect can be widely ensured for depletion.

The first to fourth embodiments can be combined as needed.

As described above, with the magnetic random access memory and its manufacturing method according to each embodiment, a cell current can be ensured while achieving miniaturization of the memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a semiconductor substrate having a gate groove and first to third grooves, the first to third grooves being formed on a bottom surface of the gate groove and the third groove being formed between the first and second grooves; and
    a gate electrode having a first gate portion formed in the first groove, a second gate portion formed in the second groove, a third gate portion formed in the third groove, and a fourth gate portion formed in the gate groove,
    wherein a cell transistor having the gate electrode has a first channel region formed in the semiconductor substrate between the first and third gate portions and a second channel region formed in the semiconductor substrate between the second and third gate portions, and a bottom surface of a source/drain diffusion layer of the cell transistor is positioned above a root of the third gate portion.

2. The device according to claim 1, wherein a gate length of the third gate portion is shorter than gate lengths of the first and second gate portions.

3. The device according to claim 1, wherein a gate length of the third gate portion is equal to gate lengths of the first and second gate portions.

4. The device according to claim 1, wherein a fin projecting from a top surface of the semiconductor substrate is formed around the third gate portion and the fin has a tube shape around the third gate portion.

5. The device according to claim 1, wherein the third gate portion is positioned at a center between the first and second gate portions.

6. The device according to claim 1, further comprising:
first and second element isolation insulating films formed below the first and second gate portions, respectively.

7. A method of manufacturing a semiconductor memory device, comprising:

forming first and second element isolating regions in a semiconductor substrate;

forming a gate groove between the first and second element isolating regions;

forming a film along a sidewall portions of the gate groove;

removing the film at a bottom surface of the gate groove and exposing the semiconductor substrate;

removing the exposed semiconductor substrate to form a third groove;

removing the film after forming the third groove, and forming first and second grooves on the first and second element isolating regions, respectively, by removing top parts of the first and second element isolating regions; and forming a gate electrode material in the first to third grooves and forming a gate electrode having first to third gate portions in the first to third grooves, wherein channel widths of fins formed between the first and third gate portions and between the second and third gate portions are defined depending on a film thickness when forming the film.

* * * * *